(12) United States Patent
Chen et al.

(10) Patent No.: US 10,356,931 B1
(45) Date of Patent: Jul. 16, 2019

(54) RACK MOUNTING SYSTEM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Yao-Tsung Chen, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/364,192

(22) Filed: Mar. 26, 2019

Related U.S. Application Data (63) Continuation-in-part of application No. 15/821,854, filed on Nov. 24, 2017.

(30) Foreign Application Priority Data

May 26, 2017 (TW) .............................. 106118005 A (51) Int. Cl.
*H05K 7/14* (2006.01)
*A47B 96/07* (2006.01)
(Continued)

(52) U.S. Cl.
CPC ............ *H05K 7/1489* (2013.01); *A47B 88/44* (2017.01); *A47B 96/061* (2013.01); *A47B 96/07* (2013.01); *F16B 7/10* (2013.01)

(58) Field of Classification Search
CPC ...... H05K 7/1489; H05K 7/186; A47B 88/44; A47B 96/061; A47B 96/07; F16B 7/10
(Continued)

(56) References Cited

U.S. PATENT DOCUMENTS 346,154 A   7/1886  Hadley
1,064,843 A  6/1913  Marsh
(Continued)

FOREIGN PATENT DOCUMENTS

JP   2006-202792 A   8/2006
JP      3191618 U   7/2014
WO     01/06293 A1  1/2001

*Primary Examiner* — Jonathan Liu
*Assistant Examiner* — Devin K Barnett
(74) *Attorney, Agent, or Firm* — Winston Hsu (57) ABSTRACT

A rack mounting system is applicable to a rack. The rack mounting system includes a mounting mechanism, a first connecting assembly and a second connecting assembly. The mounting mechanism is detachably mounted to a first side of the rack. The first connecting assembly is detachably mounted to a second side of the rack. The second connecting assembly is connected to the mounting mechanism. Wherein, the mounting mechanism includes a main body and at least one pin, the main body is configured to be detachably mounted to the rack. The at least one pin is slidably passing through the main body, so that the at least one pin is movable relative to the rack. Wherein, the first connecting assembly and the second connecting assembly are configured to carry a first chassis with a first chassis width when the at least one pin is moved to a first position.

9 Claims, 9 Drawing Sheets

(51) Int. Cl.
*A47B 88/44* (2017.01)
*F16B 7/10* (2006.01)
*A47B 96/06* (2006.01)

(58) Field of Classification Search
USPC ...... 248/424, 429, 220.21, 298.1; 312/330.1, 312/333, 334.4, 334.5, 334.44–334.47, 312/351; 211/26
See application file for complete search history.

(56) References Cited

U.S. PATENT DOCUMENTS

| | | | |
|---|---|---|---|
| 2,331,791 A | 10/1943 | Noel | |
| 2,647,641 A | 8/1953 | Tritt | |
| 2,832,549 A | 4/1958 | Youngberg | |
| 3,050,194 A * | 8/1962 | Sinninger | A47B 47/03 108/106 |
| 3,090,572 A | 5/1963 | Metcalf | |
| 3,096,731 A | 7/1963 | Lehman | |
| 3,133,768 A * | 5/1964 | Klakovich | H05K 7/1421 312/323 |
| 3,233,744 A | 2/1966 | Ripps | |
| 3,319,855 A | 5/1967 | Tucker | |
| 3,943,859 A | 3/1976 | Boone | |
| 4,159,071 A | 6/1979 | Roca | |
| 4,191,317 A | 3/1980 | Harkins | |
| 4,464,378 A | 8/1984 | Hussain | |
| 4,483,491 A | 11/1984 | Rainey | |
| 4,520,968 A | 6/1985 | Shpigelman | |
| 4,620,489 A | 11/1986 | Albano | |
| 4,646,658 A | 3/1987 | Lee | |
| 4,713,949 A | 12/1987 | Wilcox | |
| 4,799,432 A | 1/1989 | Rickner | |
| 4,827,849 A | 5/1989 | Vignale | |
| 4,870,907 A | 10/1989 | McKee | |
| D305,488 S | 1/1990 | Korpijaako | |
| 5,248,105 A | 9/1993 | Cooker | |
| 5,268,149 A | 12/1993 | Arafat | |
| 5,311,986 A | 5/1994 | Putz | |
| 5,363,773 A | 11/1994 | Chuang | |
| 5,433,152 A | 7/1995 | Henry | |
| 5,464,170 A | 11/1995 | Mitchell | |
| 5,618,008 A | 4/1997 | Dearwester | |
| 5,623,880 A | 4/1997 | Kuntz | |
| 5,638,966 A | 6/1997 | Kuntz | |
| 5,716,113 A | 2/1998 | Plourde | |
| 5,752,622 A | 5/1998 | Abell | |
| 5,779,333 A * | 7/1998 | Lautenschlager | A47B 88/43 312/334.14 |
| 5,833,337 A * | 11/1998 | Kofstad | H05K 7/1421 312/334.5 |
| 5,836,562 A * | 11/1998 | Danzyger | A47B 21/0314 248/295.11 |
| 5,853,164 A | 12/1998 | Hunt | |
| 5,868,335 A | 2/1999 | Lebrun | |
| 5,921,410 A | 7/1999 | Emery | |
| 5,941,621 A * | 8/1999 | Boulay | H05K 7/1421 248/906 |
| 6,070,957 A * | 6/2000 | Zachrai | H02B 1/32 312/265.1 |
| 6,123,303 A | 9/2000 | Huang | |
| 6,181,549 B1 | 1/2001 | Mills | |
| 6,190,081 B1 * | 2/2001 | Besserer | H02B 1/32 211/183 |
| 6,209,979 B1 * | 4/2001 | Fall | H05K 7/1489 312/319.1 |
| 6,230,903 B1 * | 5/2001 | Abbott | H05K 7/1421 211/190 |
| 6,244,448 B1 | 6/2001 | Hang | |
| 6,273,534 B1 * | 8/2001 | Bueley | A47B 46/005 211/187 |
| 6,305,556 B1 * | 10/2001 | Mayer | G06F 1/18 211/175 |
| 6,375,290 B1 * | 4/2002 | Lin | A47B 88/49 312/334.44 |
| 6,427,606 B1 | 8/2002 | Klotz | |
| 6,431,668 B1 * | 8/2002 | Reddicliffe | A47B 88/43 312/334.1 |
| 6,476,365 B1 | 11/2002 | Rios | |
| 6,497,345 B1 | 12/2002 | Wilker | |
| 6,497,465 B1 * | 12/2002 | Baker | H05K 7/1421 312/223.1 |
| 6,561,364 B1 | 5/2003 | Brunsden | |
| 6,588,866 B2 * | 7/2003 | Cheng | G11B 33/128 312/330.1 |
| 6,592,013 B1 | 7/2003 | Fujiwara | |
| 6,615,992 B1 * | 9/2003 | Lauchner | H05K 7/1489 211/175 |
| 6,629,617 B2 | 10/2003 | Osawa | |
| 6,681,942 B2 * | 1/2004 | Haney | H05K 7/1421 211/183 |
| D487,858 S | 3/2004 | Richardson | |
| 6,739,682 B2 * | 5/2004 | Shih | H02B 1/36 312/223.1 |
| 6,769,551 B2 * | 8/2004 | Rafferty | H05K 7/1492 211/192 |
| 6,866,154 B2 * | 3/2005 | Hartman | G06F 1/183 211/191 |
| 6,866,157 B2 | 3/2005 | Shone | |
| 6,883,695 B2 | 4/2005 | Orihara | |
| 6,938,967 B2 * | 9/2005 | Dubon | H05K 7/1421 312/330.1 |
| 6,948,691 B2 * | 9/2005 | Brock | H02B 1/34 211/175 |
| 6,962,397 B2 * | 11/2005 | Dobler | A47B 88/407 312/333 |
| 7,012,808 B2 * | 3/2006 | Mayer | H05K 7/1489 248/917 |
| 7,137,512 B2 * | 11/2006 | Nguyen | G06F 1/183 211/26 |
| 7,188,916 B2 * | 3/2007 | Silvestro | A47B 88/43 312/223.1 |
| 7,207,448 B1 | 4/2007 | Marino, Jr. | |
| 7,380,689 B2 | 6/2008 | Parietti | |
| 7,481,504 B2 * | 1/2009 | Chen | H05K 7/1489 312/330.1 |
| 7,530,526 B1 | 5/2009 | Powers | |
| 7,641,297 B2 * | 1/2010 | Huang | H05K 7/1489 211/26 |
| 7,823,994 B2 * | 11/2010 | Yang | H05K 7/1489 312/333 |
| 8,104,851 B2 * | 1/2012 | Lu | H05K 7/1489 312/334.5 |
| 8,210,365 B2 | 7/2012 | Van Wyk | |
| 8,261,920 B1 | 9/2012 | Matthews | |
| 8,379,410 B2 | 2/2013 | Kitten | |
| 8,607,993 B2 * | 12/2013 | Williams | A47B 88/00 211/26 |
| 8,783,474 B2 | 7/2014 | Kuhlman | |
| 8,851,300 B2 * | 10/2014 | Dykstra | A47B 46/00 211/1.57 |
| 8,910,826 B2 | 12/2014 | Rapala | |
| 9,089,215 B1 * | 7/2015 | Wu | H05K 7/1489 |
| 9,124,956 B2 * | 9/2015 | Heimann | H04Q 1/10 |
| 9,131,769 B2 * | 9/2015 | Obernesser | H05K 7/1488 |
| 9,281,676 B2 * | 3/2016 | Chen | H05K 7/1491 |
| 9,326,414 B2 * | 4/2016 | Eberle, Jr. | H05K 7/1489 |
| 9,504,181 B2 * | 11/2016 | Chen | H05K 7/1489 |
| 9,629,276 B2 * | 4/2017 | Sampath | H05K 7/1489 |
| 9,635,937 B2 * | 5/2017 | Shen | H05K 7/1488 |
| 9,699,935 B1 * | 7/2017 | Marrs | H05K 7/183 |
| 9,856,912 B2 * | 1/2018 | Chen | F16C 29/005 |
| 9,867,462 B2 * | 1/2018 | Chen | A47B 88/403 |
| 9,930,805 B2 * | 3/2018 | Chen | A47B 96/068 |
| 9,943,003 B2 * | 4/2018 | Segroves | H05K 7/1489 |
| 10,021,977 B2 * | 7/2018 | Chen | A47B 88/43 |
| 10,028,406 B2 * | 7/2018 | Chen | H05K 7/183 |
| 10,098,459 B2 * | 10/2018 | Chen | E05B 65/46 |
| 10,117,352 B2 * | 10/2018 | Chen | F16C 29/002 |
| 10,123,452 B2 * | 11/2018 | Chen | A47B 88/43 |

(56) References Cited

U.S. PATENT DOCUMENTS

| | | | |
|---|---|---|---|
| 10,130,001 B2* | 11/2018 | Chen | H05K 7/1489 |
| 10,136,548 B2* | 11/2018 | Chen | F16C 29/004 |
| 10,172,459 B2* | 1/2019 | Chen | A47B 88/463 |
| 10,213,017 B2* | 2/2019 | Chen | H05K 7/1489 |
| 10,221,889 B2* | 3/2019 | Chen | F16C 29/004 |
| 10,244,867 B2* | 4/2019 | Liang | A47B 88/427 |
| 10,244,868 B2* | 4/2019 | Chen | A47B 88/49 |
| 2002/0171003 A1 | 11/2002 | Johnson | |
| 2003/0019824 A1* | 1/2003 | Gray | A47B 57/30 211/26 |
| 2003/0136749 A1* | 7/2003 | Williams | H05K 7/183 211/26 |
| 2003/0161134 A1* | 8/2003 | Besserer | H02B 1/34 361/826 |
| 2004/0079712 A1* | 4/2004 | Mayer | A47B 57/485 211/26 |
| 2004/0108797 A1* | 6/2004 | Chen | A47B 88/427 312/334.7 |
| 2004/0206651 A1 | 10/2004 | Saito | |
| 2005/0285493 A1* | 12/2005 | Hu | H05K 7/1489 312/334.4 |
| 2006/0000961 A1* | 1/2006 | Wei-Chieh | G06F 1/184 248/223.41 |
| 2006/0124567 A1 | 6/2006 | Bove | |
| 2006/0157436 A1 | 7/2006 | Iwamoto | |
| 2007/0039913 A1* | 2/2007 | Chen | A47B 88/43 211/192 |
| 2008/0142542 A1 | 6/2008 | Petry | |
| 2008/0308512 A1 | 12/2008 | Knepfle | |
| 2009/0114785 A1* | 5/2009 | Huang | H05K 7/1489 248/220.31 |
| 2009/0219701 A1* | 9/2009 | Wu | H05K 7/1494 361/727 |
| 2009/0283652 A1* | 11/2009 | Chen | H05K 7/1489 248/298.1 |
| 2010/0200523 A1* | 8/2010 | Henderson | H05K 7/1489 211/26 |
| 2010/0243586 A1* | 9/2010 | Henderson | H05K 7/1489 211/26.2 |
| 2011/0111686 A1* | 5/2011 | Hruby | H05K 7/20572 454/184 |
| 2011/0181161 A1* | 7/2011 | Hsiao | H05K 7/18 312/223.1 |
| 2011/0279973 A1* | 11/2011 | Terwilliger | H05K 7/1489 361/679.58 |
| 2012/0074281 A1* | 3/2012 | Chen | H05K 7/1421 248/224.8 |
| 2012/0091075 A1* | 4/2012 | Chapel | H05K 7/1489 211/26 |
| 2012/0091251 A1 | 4/2012 | Smith | |
| 2012/0261436 A1 | 10/2012 | Farrell | |
| 2012/0288221 A1* | 11/2012 | Jahrling | A47B 88/47 384/20 |
| 2012/0314353 A1 | 12/2012 | Williams | |
| 2013/0016929 A1 | 1/2013 | Fan | |
| 2013/0181102 A1 | 7/2013 | Tooley | |
| 2014/0265785 A1* | 9/2014 | Chen | A47B 88/40 312/334.1 |
| 2015/0022071 A1* | 1/2015 | Chen | G07F 11/04 312/334.8 |
| 2015/0201754 A1* | 7/2015 | Chen | A47B 96/025 248/219.3 |
| 2015/0260446 A1 | 9/2015 | Levie | |
| 2015/0296982 A1* | 10/2015 | Chen | A47B 88/43 312/334.8 |
| 2015/0313036 A1 | 10/2015 | Li | |
| 2016/0165761 A1* | 6/2016 | Cox | G06F 1/20 361/679.53 |
| 2016/0278234 A1* | 9/2016 | Chen | H05K 7/1489 |
| 2016/0278525 A1* | 9/2016 | Chen | A47B 96/07 |
| 2016/0280422 A1 | 9/2016 | Dorrance | |
| 2016/0296017 A1* | 10/2016 | Chen | A47B 88/49 |
| 2017/0013959 A1* | 1/2017 | Chen | A47B 96/07 |
| 2017/0027395 A1 | 2/2017 | Prior | |
| 2017/0095079 A1* | 4/2017 | Chen | H05K 7/1489 |
| 2017/0156493 A1 | 6/2017 | Trujillo | |
| 2017/0303426 A1* | 10/2017 | Chen | A47B 96/07 |
| 2017/0340110 A1* | 11/2017 | Chen | A47B 88/403 |
| 2017/0363144 A1* | 12/2017 | Chen | F16C 29/004 |
| 2017/0367207 A1* | 12/2017 | Chen | H05K 7/1421 |
| 2018/0014701 A1 | 1/2018 | Kennedy | |
| 2018/0070724 A1* | 3/2018 | Chen | A47B 57/34 |
| 2018/0073559 A1* | 3/2018 | Chen | A47B 96/07 |
| 2018/0084907 A1* | 3/2018 | Chen | H05K 7/1489 |
| 2018/0084908 A1* | 3/2018 | Chen | H05K 7/183 |
| 2018/0098626 A1* | 4/2018 | Chen | A47B 88/43 |
| 2018/0116398 A1* | 5/2018 | Chen | A47B 88/43 |
| 2018/0168341 A1* | 6/2018 | Chen | A47B 88/43 |
| 2018/0199714 A1* | 7/2018 | Chen | A47B 88/75 |
| 2018/0220797 A1* | 8/2018 | Chen | A47B 88/423 |
| 2018/0360213 A1* | 12/2018 | Chen | A47B 88/477 |
| 2018/0360215 A1* | 12/2018 | Chen | H05K 7/1489 |
| 2018/0368278 A1* | 12/2018 | Chen | A47B 88/427 |
| 2019/0029419 A1* | 1/2019 | Chen | A47B 88/427 |
| 2019/0059580 A1* | 2/2019 | Chen | H05K 7/1489 |
| 2019/0059585 A1* | 2/2019 | Chen | A47B 57/38 |

* cited by examiner

RACK MOUNTING SYSTEM

CROSS REFERENCE TO RELATED APPLICATIONS

This application is a continuation-in-part of U.S. application Ser. No. 15/821,854, filed on Nov. 24, 2017. This application claims the benefit of U.S. application Ser. No. 15/821,854, which was filed on Nov. 24, 2017, and is incorporated herein by reference.

BACKGROUND OF THE INVENTION

1. Field of the Invention

The present invention relates to a rack mounting system, and more particularly, to a rack mounting system capable mounting chassis with different width to a rack.

2. Description of the Prior Art

Generally, a rack has a first side and a second side defining a rack width. A rack mounting system includes at least one pair of connecting assemblies, such as rail members, respectively mounted at two sides of the rack in order to mount a chassis to the rack.

The current rack mounting system can only to be applied to a rack and a chassis comply with the same specification. Once specifications or sizes of the rack and the chassis do not match, the chassis cannot be mounted to the rack.

With rapid development of information technology, dimensions (such as a width dimension) of a chassis are getting bigger to accommodate more electronic apparatuses or related components. U.S. Pat. No. 9,131,769 B2 discloses such specification for the chassis with a greater width. However, when the specifications or sizes of the rack and chassis do not match, the solution disclosed in the aforementioned invention is to install a plurality of posts at inner regions of the rack, in order to reduce the original rack width of the rack. However, according to such design, only the chassis complied with one predetermined specification can be mounted to the width-reduced rack.

U.S. Pat. No. 3,133,768 discloses a slide rail assembly (22) capable of being mounted at different position of a post through a plurality of elongate slots (47) of a flange (28), such that position of the slide rail assembly (22) can be adjusted inwardly or outwardly, to make a chassis to fit in a rack system. However, position of the slide rail assembly (22) relative to the post is adjusted via the plurality of elongated slots (47). Furthermore, the slide rail assembly (22) is required to be detached from the post and be remounted on the post during adjustment of the position of the slide rail assembly (22), which results in time consuming and enhancement of labors for the adjustment of the position of the slide rail assembly (22).

SUMMARY OF THE INVENTION

The present invention provides a rack mounting system capable mounting chassis with different width to a rack.

According to an embodiment of the present invention, a rack mounting system is applicable to a rack. The rack mounting system includes a mounting mechanism, a first connecting assembly and a second connecting assembly. The mounting mechanism is configured to be detachably mounted to a first side of the rack. The first connecting assembly is configured to be detachably mounted to a second side of the rack. The second connecting assembly is connected to the mounting mechanism. Wherein, the mounting mechanism includes a main body and at least one pin. The main body is configured to be detachably mounted to the rack and independent from the second connecting assembly. The at least one pin with an end directly connected to the second connecting assembly is slidably disposed passing through the main body, so that the at least one pin is movable relative to the first side of the rack. Wherein, the first connecting assembly and the second connecting assembly are configured to carry a first chassis with a first chassis width when the at least one pin of the mounting mechanism is moved to a first position relative to the first side of the rack.

Preferably, the first connecting assembly has a first connecting width, the second connecting assembly has a second connecting width, wherein the mounting mechanism inwardly extends a first mounting length from the first side of the rack when the mounting mechanism is moved to the first position relative to the first side of the rack, the first mounting length is greater than the first connecting width and the second connecting width.

Preferably, the first connecting assembly and the second connecting assembly are configured to carry a second chassis with a second chassis width when the mounting mechanism is moved to an extension position from the first position relative to the first side of the rack, the second chassis width is different from the first chassis width.

Preferably, the first connecting assembly includes a first fixed rail, and the second connecting assembly includes a second fixed rail, the first fixed rail and the second fixed rail are configured to fixedly mount the first chassis with the first chassis width into the rack.

Preferably, the first connecting assembly includes a first fixed rail and a first movable rail, and the second connecting assembly includes a second fixed rail and a second movable rail, the first movable rail and the second movable rail allow the first chassis with the first chassis width to be pulled out of the first rack.

According to another embodiment of the present invention, a rack mounting system is applicable to a first rack or a second rack. The first and second racks respectively include a first post having a first fastening hole. The rack mounting system includes a first connecting assembly, a second connecting assembly and a mounting mechanism. The first connecting assembly is configured to be connected to a first side of a chassis. The second connecting assembly is configured to be connected to a second side of the chassis. The mounting mechanism has a lug portion and a connecting portion connected to the lug portion and the second connecting assembly. A first rack hole and a second rack hole are formed on the lug portion. The first rack hole and the second rack hole are spaced by a first mounting length. Wherein, when the mounting mechanism is mounted to a first side of the first rack and the first connecting assembly is mounted to a second side of the first rack, the first rack hole is configured to be fastened on the first fastening hole of the first post of the first rack. When the mounting mechanism inwardly extends the first mounting length from the first side of the first rack, when in use, the first rack has a first rack width. Wherein, when the mounting mechanism is mounted to a first side of the second rack and the first connecting assembly is mounted to a second side of the second rack, the second rack hole is configured to be fastened on the first fastening hole of the first post of the second rack. When the mounting mechanism inwardly extends the second mounting length from the first side of the second rack, when in use, the second rack has a second rack width different from the first rack width. Wherein, when in use, one of the first rack hole and the second rack hole is configured to be fastened.

According to another embodiment of the present invention, a rack system is applicable to a rack. The rack includes a first post having a first fastening hole. The rack mounting system includes a rack, a mounting mechanism, a first connecting assembly and a second connecting assembly. The rack has a first side and a second side. The mounting mechanism is detachably mounted to the first side of the rack. The first connecting assembly detachably is mounted to the second side of the rack. The second connecting assembly is connected to the mounting mechanism. Wherein, the mounting mechanism having a lug portion and a connecting portion connected to the lug portion and the second connecting assembly. A first chassis hole and a second chassis hole are formed on the connecting portion. A second fastening hole is formed on the lug portion. Wherein, the first connecting assembly and the second connecting assembly are configured to mount a first chassis with a first chassis width to the rack when the first chassis hole is fastened on the second fastening hole of the lug portion, leading the distance between the first connecting assembly and the second connecting assembly is the first chassis width. Wherein, the first connecting assembly and the second connecting assembly are configured to mount a second chassis with a second chassis width to the rack when the second chassis hole is fastened on the second fastening hole of the lug portion, leading the distance between the first connecting assembly and the second connecting assembly is the second chassis width, when in use, the second chassis width is different from the first chassis width. Wherein, when in use, one of the first chassis hole and the second chassis hole is configured to be fastened.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
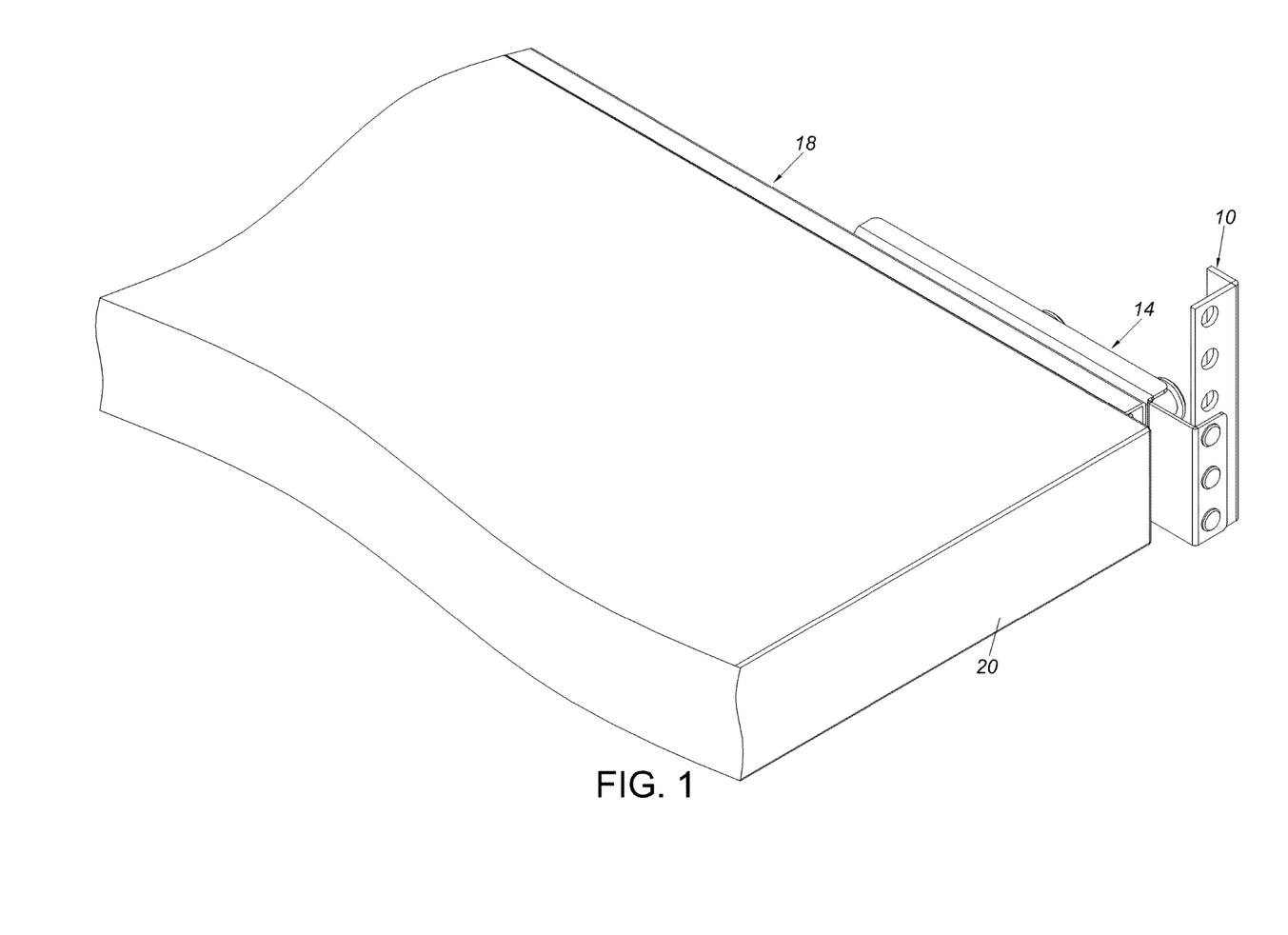
FIG. 1 is a diagram showing a portion of a first chassis mounted to one side of a first rack according to a first embodiment of the present invention.
Figure 2:
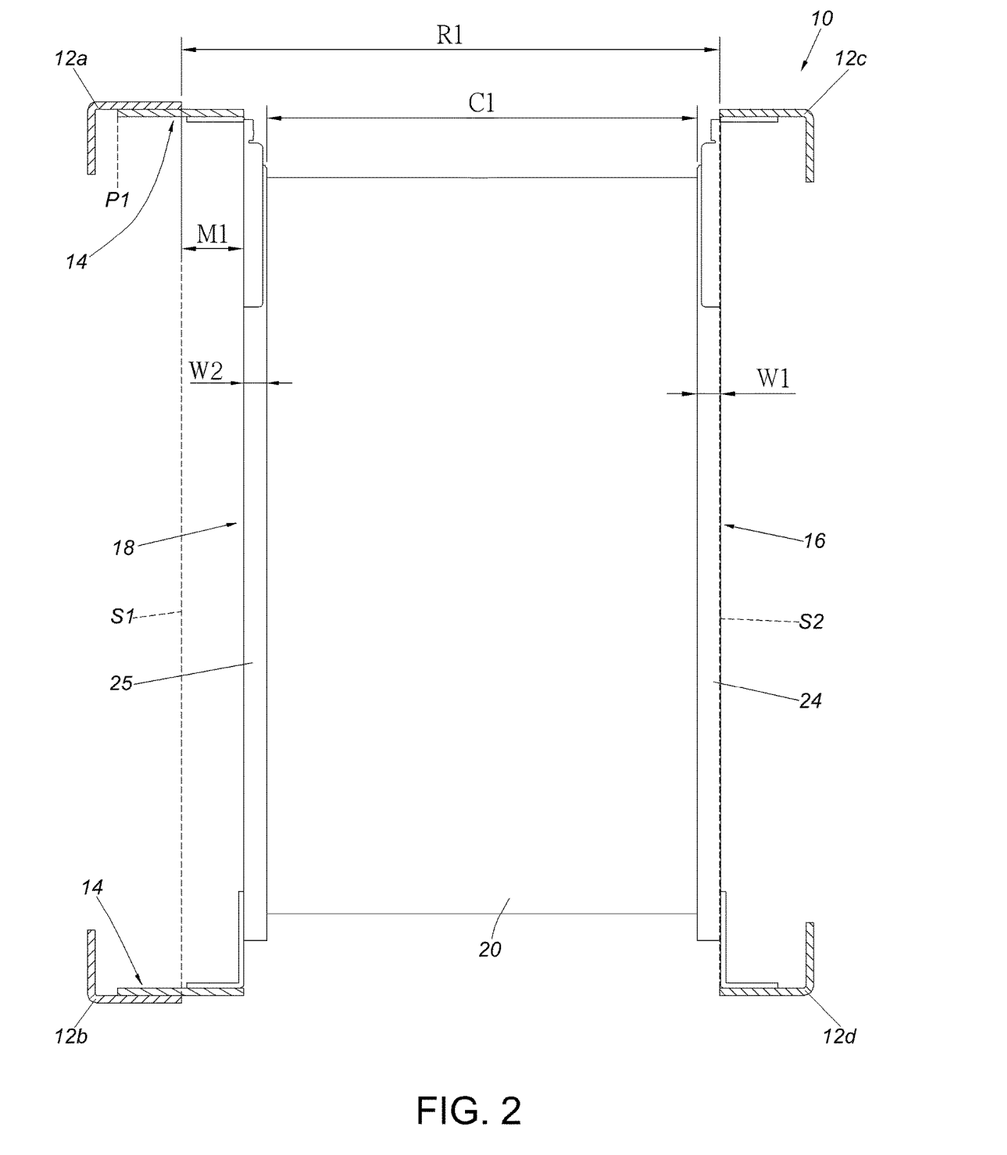
FIG. 2 is a diagram showing the first chassis mounted to the first rack according to an embodiment of the present invention.

As shown in FIG. 1 and FIG. 2, a rack mounting system is applicable to a first rack 10. The first rack 10 has a plurality of posts, such as a first post 12a, a second post 12b, a third post 12c and a fourth post 12d. Wherein, the first post 12a and the second post 12b are defined as a first side S1 of the first rack 10, the third post 12c and the fourth post 12d are defined as a second side S2 of the first rack 10, and a first rack width R1 is defined between the first side S1 and the second side S2 of the first rack 10.

The rack mounting system includes a mounting mechanism 14, a first connecting assembly 16 and a second connecting assembly 18. Wherein, the mounting mechanism 14 is detachably mounted to one of the first side S1 and the second side S2 of the first rack 10. In the present embodiment, the mounting mechanism 14 includes two separated components respectively detachably mounted to the first post 12a and the second post 12b of the first rack 10. That is, the mounting mechanism 14 is detachably mounted to the first side S1 of the first rack 10. In another embodiment, the mounting mechanism 14 can be a single component detachably mounted to the first post 12a and the second post 12b of the first rack 10, but the present invention is not limited thereto. The first connecting assembly 16 is detachably mounted to the other one of the first side S1 and the second side S2 of the first rack 10. In the present embodiment, the first connecting assembly 16 is detachably mounted to the second side S2 of the first rack 10. In addition, the second connecting assembly 18 is connected to the mounting mechanism 14. A first chassis width C1 is defined between the first connecting assembly 16 and the second connecting assembly 18. A first chassis 20 with the first chassis width C1 can be mounted to the first connecting assembly 16 and the second connecting assembly 18. For example, the first connecting assembly 16 can be connected to a first side of the first chassis 20, and the second connecting assembly 18 can be connected to a second side of the first chassis 20.

Preferably, the mounting mechanism 14 inwardly extends a first mounting length M1 relative to the first side S1 of the first rack 10. The first connecting assembly 16 has a first connecting width W1. The second connecting assembly 18 has a second connecting width W2. The first mounting length M1 is greater than the first connecting width W1 and the second connecting width W2.

Figure 3:
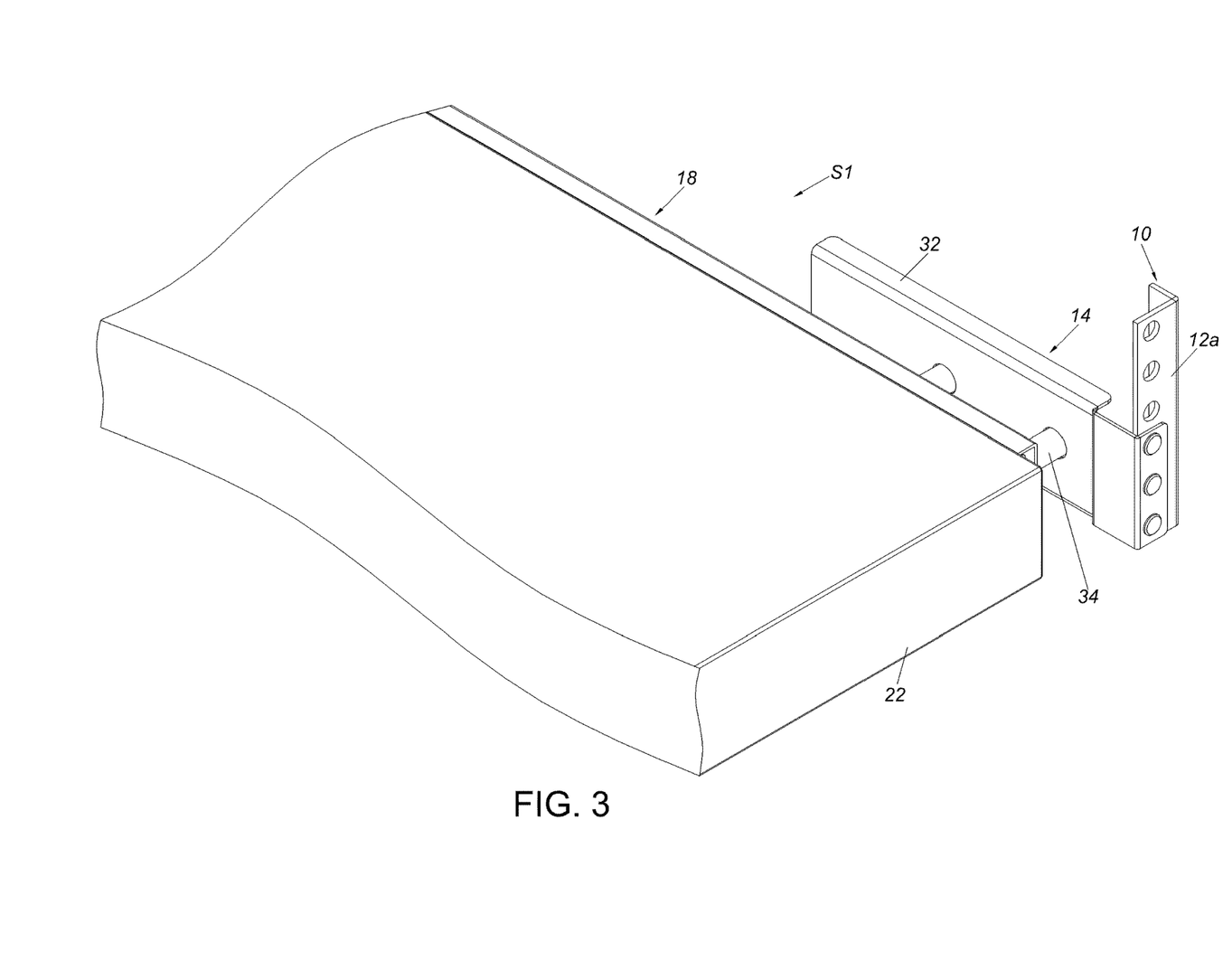
FIG. 3 is a diagram showing a portion of a second chassis mounted to one side of the first rack according to the first embodiment of the present invention.
Figure 4:
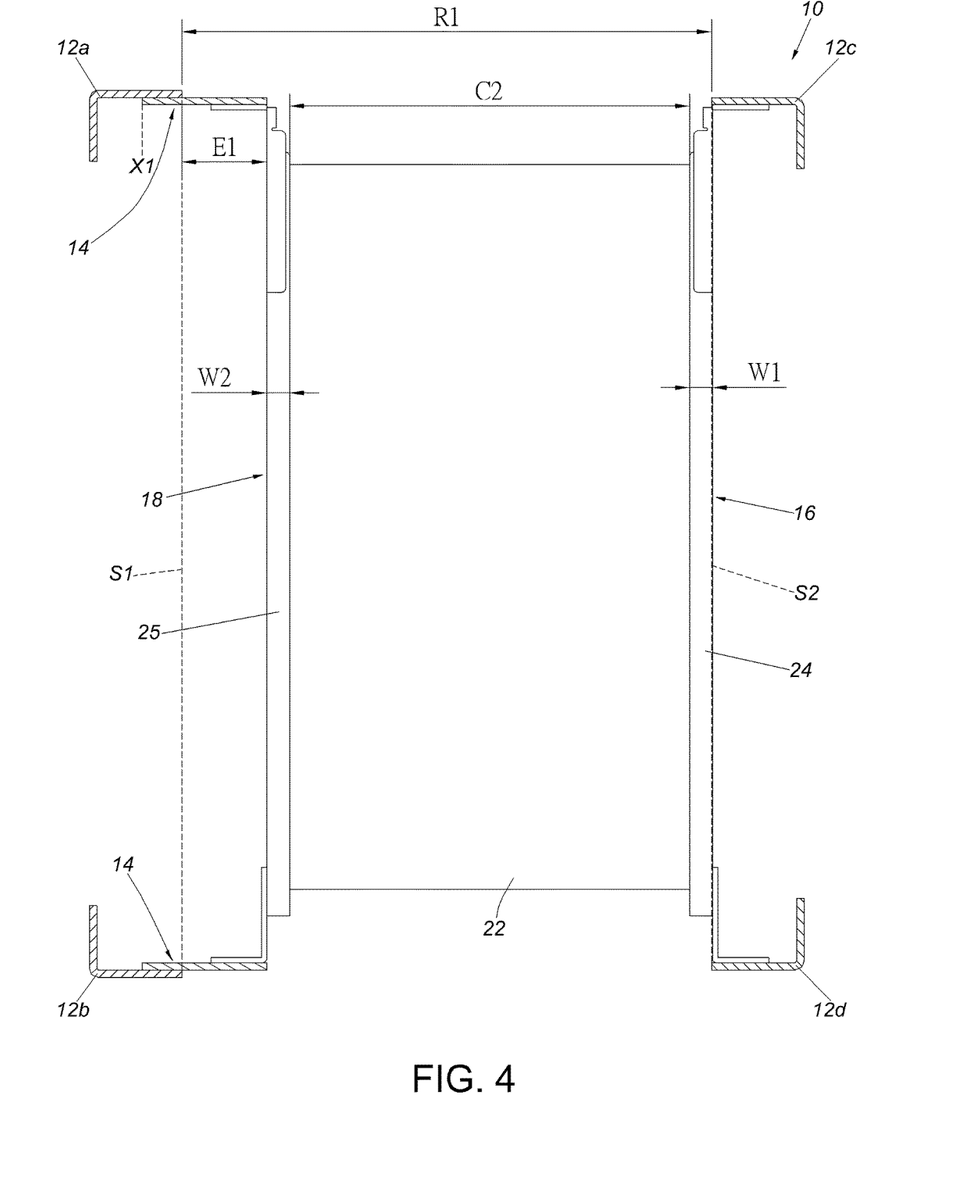
FIG. 4 is a diagram showing the second chassis mounted to the first rack according to an embodiment of the present invention.

Please refer to FIG. 2 to FIG. 4. Preferably, the mounting mechanism 14 (for ease of explanation, structure and adjusting mechanism of the mounting mechanism 14 are simplified in FIG. 2 and FIG. 4) can be adjusted to move from a first position P1 to an extension position X1, such that the mounting mechanism 14 inwardly extends an extension length E1 from the first side S1 of the first rack 10 for forming a second chassis width C2 between the first connecting assembly 16 and the second connecting assembly 18, in order to mount a second chassis 22 with the second chassis width C2 to the first connecting assembly 16 and the second connecting assembly 18. In another embodiment, the mounting mechanism 14 can be further adjusted to mount a chassis with a different chassis width to the first rack 10.

As shown in FIG. 1 and FIG. 3, FIG. 3 is diagrams illustrating a first embodiment of the present invention. The mounting mechanism 14 further includes a main body 32 and at least one pin 34. The main body 32 is configured to be detachably mounted to the rack 10 and independent from the second connecting assembly 18. The at least one pin 34 with an end directly connected to the second connecting assembly 18 slidably passes through the main body 32, such that the mounting mechanism 14 is movable relative to the first side S1 of the rack 10. The main body 32 of the mounting mechanism 14 and the second connecting assembly 18 are separated components. When the distance between the second connecting assembly 18 and the first connecting assembly 16 is adjusted, the at least one pin 34 of the mounting mechanism 14 is moved relative to the main body 32 and the second connecting assembly 18 is driven by the at least one pin 34 with an end directly connected to the second connecting assembly 18, such that chassis with different width can be mounted on the first connecting assembly 16 or the second connecting assembly 18 through the rack mounting system. Wherein, the main body 32 of the mounting mechanism 14 is independent from the second connecting assembly 18. Therefore, when the second connecting assembly 18 is moved, position of the main body 32 can be held on the first post 12a. The mounting mechanism 14 includes a moving portion (the at least one pin 34) and a fixing portion (the main body 32), such that the accuracy of function of the mechanism is improved.

Therefore, the mounting mechanism 14 allows the first chassis 20 with the first chassis width C1 and the second chassis 22 with the second chassis width C2 to be mounted to the first rack 10 with the first rack width R1.

Preferably, the first connecting assembly 16 includes a first fixed rail 24, and the second connecting assembly 18 includes a second fixed rail 25. The first fixed rail 24 and the second fixed rail 25 are configured to fixedly mount the first chassis 20 to into the first rack 10. Wherein, specifications of the first fixed rail 24 and the second fixed rail 25 can be identical or different, the present invention is not limited thereto.

Figure 5:
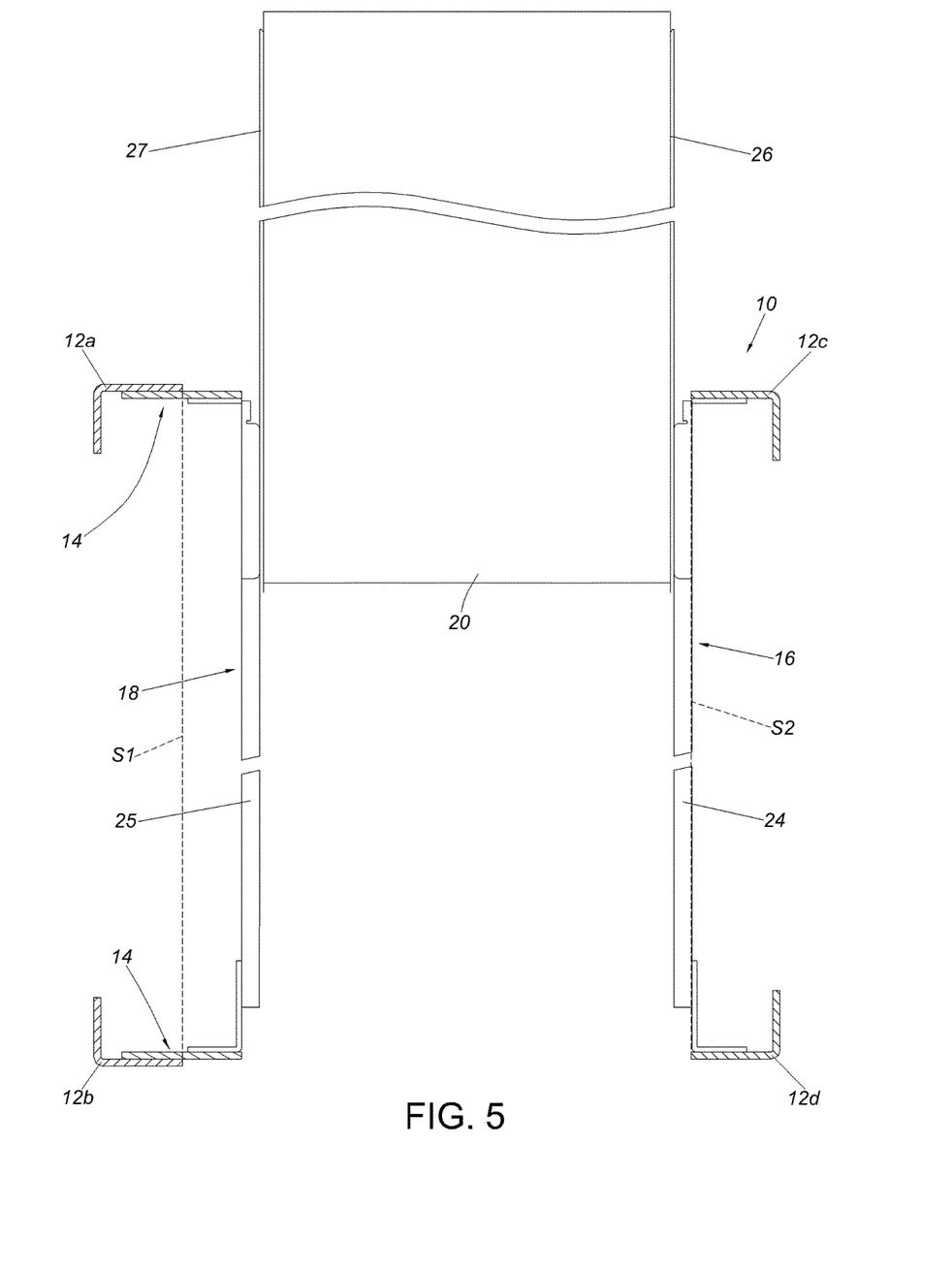
FIG. 5 is a diagram showing the first chassis being pulled out of the rack according to an embodiment of the present invention.

Preferably, as shown in FIG. 5, the first connecting assembly 16 includes the first fixed rail 24 and a first movable rail 26, and the second connecting assembly 18 includes the second fixed rail 25 and a second movable rail 27. The first movable rail 26 and the second movable rail 27 allow the first chassis 20 to be pulled out of the first rack 10. Wherein, specifications of rails of the first connecting assembly 16 and the second connecting assembly 18 can be identical or different, the present invention is not limited thereto.

Figure 6:
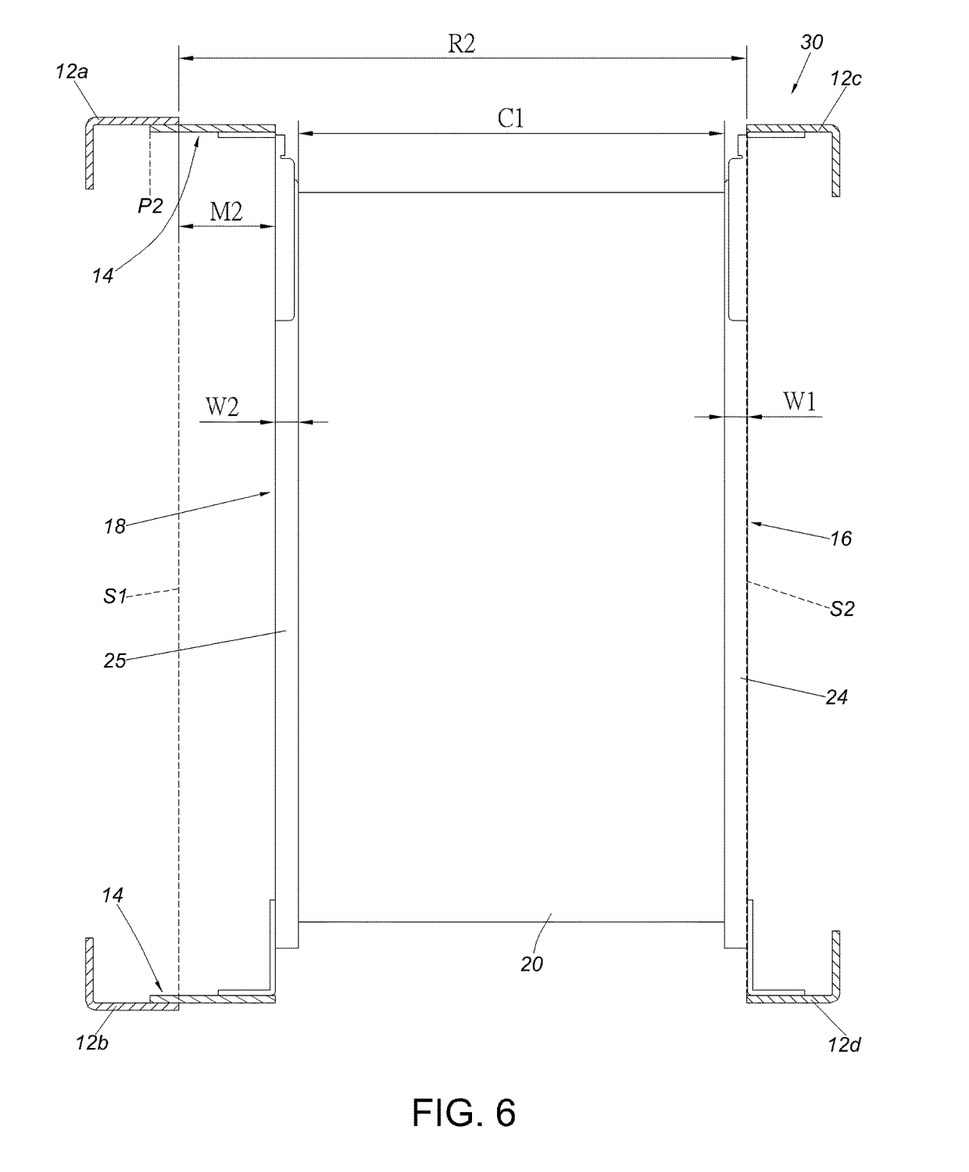
FIG. 6 is a diagram showing the first chassis mounted to a second rack according to an embodiment of the present invention.

Please refer to FIG. 6. Preferably, the rack mounting system can be also applied to a second rack 30. The second rack 30 has a second rack width R2 different from the first rack width R1 of the first rack 10. The mounting mechanism 14 can be adjusted to move to a second position P2 relative to a first side S1 of the second rack 30, such that the mounting mechanism 14 inwardly extends a second mounting length M2 (different from the first mounting length M1) from the first side S1 of the second rack 30 for forming the first chassis width C1 between the first connecting assembly 16 and the second connecting assembly 18, in order to mount the first chassis 20 with the first chassis width C1 to the first connecting assembly 16 and the second connecting assembly 18. The second mounting length M2 is greater than the first connecting width W1 and the second connecting width W2.

Figure 2A:
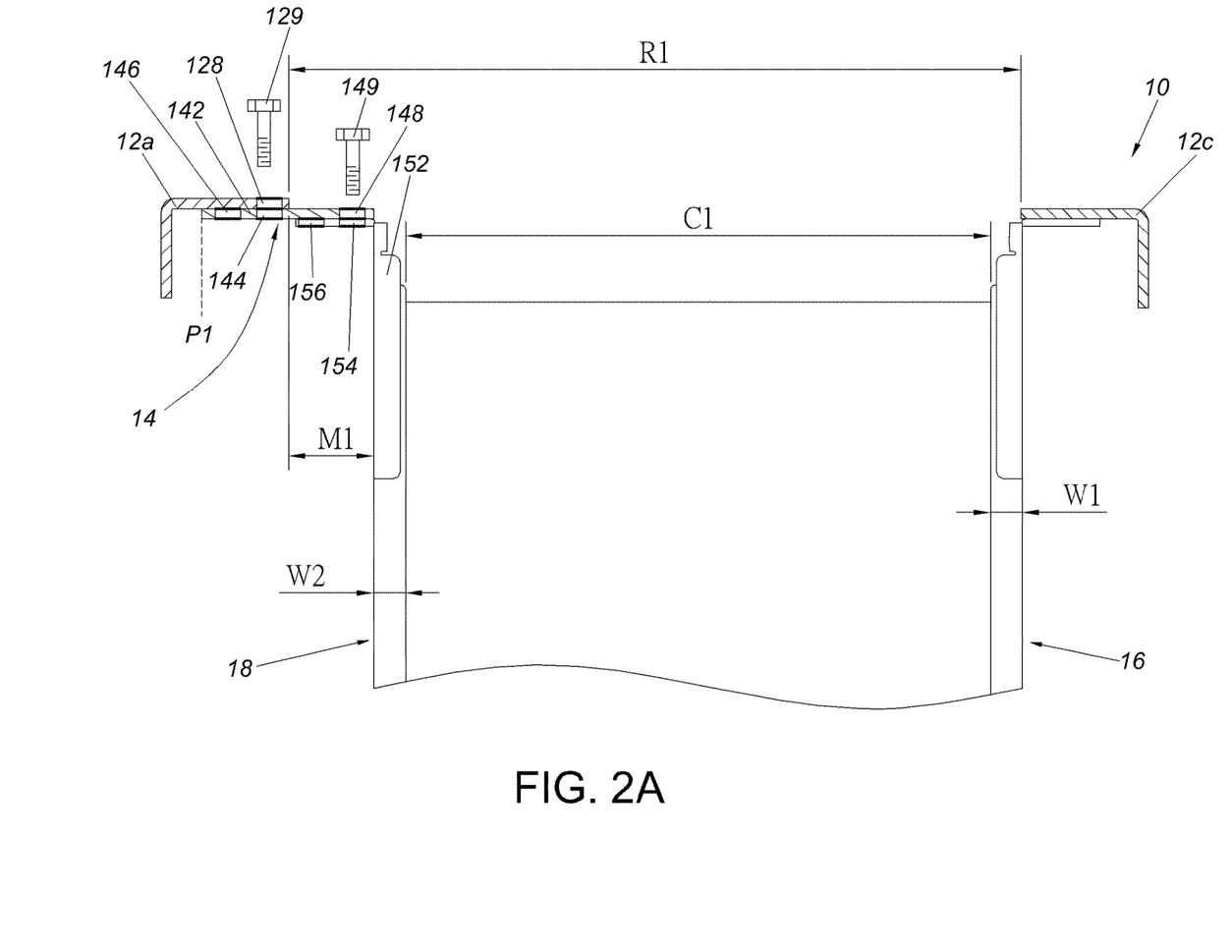
FIG. 2A is a diagram showing the first chassis mounted to the first rack according to a second embodiment of the present invention.
Figure 4A:
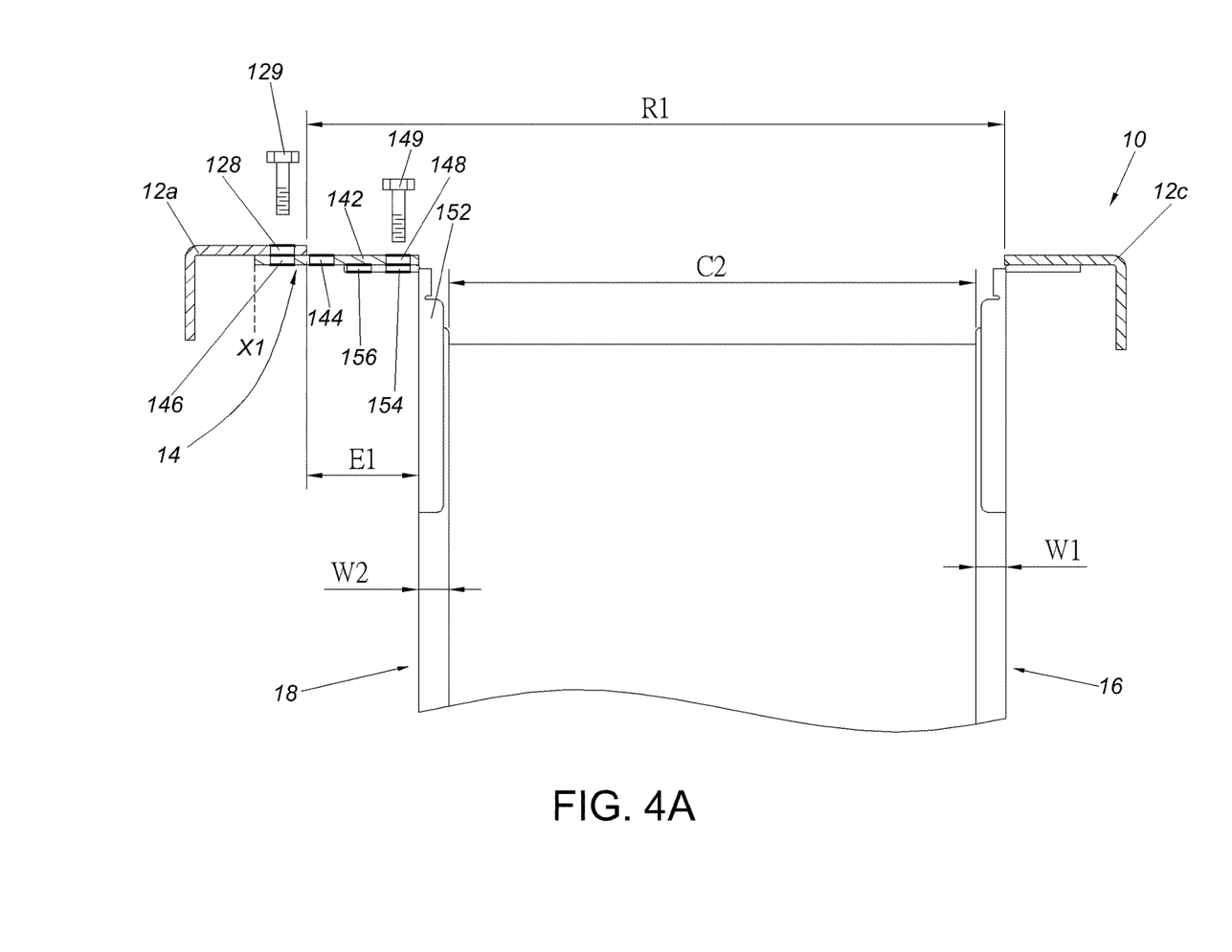
FIG. 4A is a diagram showing the second chassis mounted to the first rack according to the second embodiment of the present invention.
Figure 6A:
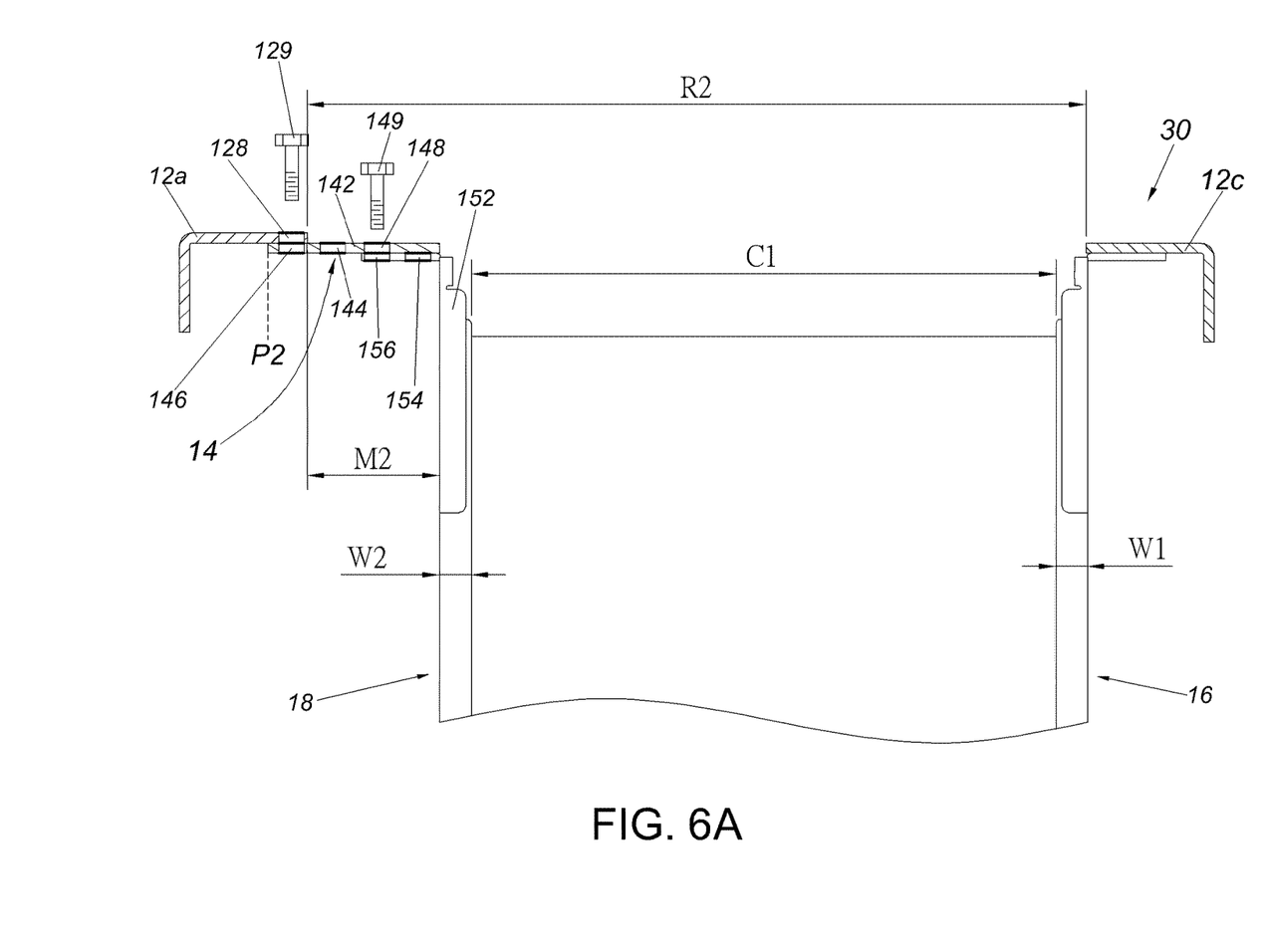
FIG. 6A is a diagram showing the first chassis mounted to a second rack according to the second embodiment of the present invention

Please refer to FIG. 2A, FIG. 4A and FIG. 6A. FIG. 2A, FIG. 4A and FIG. 6A are diagrams illustrating a second embodiment of the present invention. The mounting mechanism 14 further includes a lug portion 142 and a connecting portion 152 connected to the lug portion 142 and the second connecting assembly 18. The first post 12a has a first fastening hole 128. A first rack hole 144, a second rack hole 146 and a second fastening hole 148 are formed on the lug portion 142. A first chassis hole 154 and a second chassis hole 156 are formed on the connecting portion 152. When the first rack hole 144 of the lug portion 142 of the mounting mechanism 14 is fastened on the first fastening hole 128 of the first post 12a of the rack 10, the lug portion 142 of the mounting mechanism 14 is located on the first position P1. Moreover, when the first rack hole 144 is fastened on the first fastening hole 128 of the rack 10 and the first chassis hole 154 of the connecting portion 152 is fastened on the second fastening hole 148 of the lug portion 142, the first chassis width C1 is defined between the first connecting assembly 16 and the second connecting assembly 18 (please refer to FIG. 2A). When the second rack hole 146 of the lug portion 142 of the mounting mechanism 14 is fastened on the first fastening hole 128 of the rack 10, the lug portion 142 of the mounting mechanism 14 is located on the extension position X1. Moreover, when the second rack hole 146 is fastened on the first fastening hole 128 of the rack 10 and the first chassis hole 154 of the connecting portion 152 is fastened on the second fastening hole 148 of the lug portion 142, the second chassis width C2 is defined between the first connecting assembly 16 and the second connecting assembly 18 (please refer to FIG. 4A). In other words, when the rack mounting system of the second embodiment of the present invention is mounted on the rack 10 with the first rack width R1, the distance between the first connecting assembly 16 and the second connecting assembly 18 can be adjusted through the first rack hole 144 and the second rack hole 146 of the lug portion 142, such that chassis with different width can be mounted on the rack 10. In addition, when the second rack hole 146 of the lug portion 142 of the mounting mechanism 14 is fastened on the first fastening hole 128 of the first post 12a of the rack 30, the lug portion 142 of the mounting mechanism 14 is located on the second position P2. Moreover, when the second rack hole 146 is fastened on the first fastening hole 128 of the rack 30 and the second chassis hole 156 of the connecting portion 152 is fastened on the second fastening hole 148 of the lug portion 142, the first chassis width C1 is defined between the first connecting assembly 16 and the second connecting assembly 18 (please refer to FIG. 6A). In other words, please refer to FIG. 2A and FIG. 6A. When the first chassis 20 with the first chassis width C1 is mounted on different racks with different rack width, the distance between the first connecting assembly 16 and the second connecting assembly 18 of the rack mounting system of the second embodiment of the present invention can be adjusted through the first chassis hole 154 and the second chassis hole 156 of the connecting portion 152, such that the first chassis 20 can be mounted on the rack 10 with the first rack width R1 and can also be mounted on the rack 30 with the second rack width R2. According to above arrangement, the rack mounting system of an embodiment of the present invention is capable of mounting different chassis on different racks.

The lug portion 142 of the mounting mechanism 14 of the second embodiment of the present invention has three holes. Wherein, one of the first rack hole 144 and the second rack hole 146 is fastened on the first fastening hole 128 of the first post 12a by a first fastening member 129, such that the rack mounting system is mounted on the first post. The first rack hole 144 and the second rack hole 146 are configured to be fastened to be cooperated with different chassis and different racks. In other words, one of the first rack hole 144 and the second rack hole 146 is chosen to be fasten, in order to choose rack width of a rack or choose chassis width of chassis.

Furthermore, the connecting portion 152 of the mounting mechanism 14 of the second embodiment of the present invention has two holes. Wherein, one of the first chassis hole 154 and the second chassis hole 156 is fastened on the second fastening hole 148 of the lug portion 142 by a second fastening member 149, such that the distance between the first connecting assembly 16 and the second connecting assembly 18 can be adjusted. The first chassis hole 154 and the second chassis hole 156 are configured to be fastened to be cooperated with different chassis and different racks. In other words, one of first chassis hole 154 and the second chassis hole 156 is chosen to be fasten, in order to choose rack width of a rack or choose chassis width of chassis. When a chassis hole and a rack hole are chosen to be fastened on a fastening hole, the rack width and the chassis width are settled. The rack mounting system of the second embodiment of the present invention can be adjusted without alignment.

Therefore, the first chassis 20 with the first chassis width C1 can be mounted to the first rack 10 with the first rack width R1 as shown in FIG. 2. Moreover, the first chassis 20 with the first chassis width C1 can also be mounted to the second rack 30 with the second rack width R2 as shown in FIG. 6.

According to the aforementioned illustration, the present invention is characterized in that: when the mounting mechanism 14 inwardly extends the first mounting length M1 relative to the first rack 10, the first chassis 20 with the first chassis width C1 can be mounted to the first rack 10 with the first rack width R1; and when the mounting mechanism 14 is adjusted to inwardly extend the second mounting length M2 relative to the second rack 30, the first chassis 20 with the first chassis width C1 can be mounted to the second rack 30 with the second rack width R2.

In another embodiment, the present invention is characterized in that: when the mounting mechanism 14 of the connecting assembly inwardly extends the first mounting length M1 relative to the first rack 10, the first chassis 20 with the first chassis width C1 can be mounted to the first rack 10 with the first rack width R1; and when the mounting mechanism 14 is adjusted to inwardly extends the extension length E1 relative to the first rack 10, the second chassis 22 with the second chassis width C2 can be mounted to the first rack 10 with the first rack width R1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rail mounting system configured to be mounted on a first rack or a second rack, the first and second racks each comprising a first post having a first fastening hole respectively, the rail mounting system comprising:
   a first connecting assembly rail configured to be connected to a first side of a first chassis or a first side of a second chassis;
   a second connecting assembly rail configured to be connected to a second side of the first chassis or a second side of the second chassis opposite the first side of the first chassis or the second chassis respectively; and
   a mounting mechanism having a planar lug portion and a generally L-shaped connecting portion connected to the lug portion and the second connecting assembly rail, wherein a first rack hole, a second rack hole, and a second fastening hole are formed through the lug portion, wherein the first rack hole, the second rack hole, and the second fastening hole are each horizontally spaced apart from each other, wherein the connecting portion has a flange portion that comprises a first chassis hole therethrough;
   wherein when the mounting mechanism is mounted to a first side of the first rack and the first connecting assembly is mounted to a second side of the first rack, the first rack hole is aligned with the first fastening hole of the first post of the first rack and a first fastener is inserted through the first rack hole and the first fastening hole of the first post of the first rack to connect the mounting mechanism to the first rack, and the second fastening hole is aligned with the first chassis hole and a second fastener is inserted through the second fastening hole and the first chassis hole to connect the connecting portion to the lug portion; the mounting mechanism inwardly extends a first mounting length from the first side of the first rack, and a first rack width is defined between the first connecting assembly rail and the second connecting assembly rail to receive the first chassis having a first chassis width substantially equal to the first rack width;
   wherein when the mounting mechanism is mounted to a first side of a second rack and the first connecting assembly is mounted to the second side of the second rack, the second rack hole is aligned with the first fastening hole of the first post of the second rack and the first fastener is inserted through the second rack hole and the first fastening hole of the first post of the second rack to connect the mounting mechanism to the second rack, and the second fastening hole is aligned with the first chassis hole and the second fastener is inserted through the second fastening hole and the first chassis hole to connect the connecting portion to the lug portion; and the mounting mechanism inwardly extends a second mounting length from the first side of the second rack, wherein second mounting length is different than the first mounting length, and a second rack width is defined between the first connecting assembly rail and the second connecting assembly rail to receive the second chassis having a second chassis width, and the second rack width is different than the first rack width.

2. The rail mounting system of claim 1, wherein the first connecting assembly rail has a first connecting width, the second connecting assembly rail has a second connecting width; wherein the first mounting length is greater than the first connecting width and the second connecting width, and the second mounting length is greater than the first connecting width and the second connecting width.

3. The rail mounting system of claim 1, wherein the first connecting assembly rail comprises a first fixed rail, and the second connecting assembly rail comprises a second fixed rail, the first fixed rail and the second fixed rail are configured to fixedly mount the first chassis or the second chassis into the first rack or the second rack respectively.

4. The rail mounting system of claim 1, wherein the first connecting assembly rail comprises a first fixed rail and a first movable rail, and the second connecting assembly rail comprises a second fixed rail and a second movable rail, the first movable rail and the second movable rail are configured to allow the first chassis or the second chassis to be pulled out of the first rack or the second rack respectively.

5. A rack system comprising:
a rack having a first post on a first side of the rack and a second post on a second side of the rack, wherein the first post has a first fastening hole therethrough;
a mounting mechanism detachably mounted to the first post of the rack;
a first connecting assembly rail detachably mounted to the second post of the rack, wherein the first connecting assembly rail is configured to be connected to a first side of a first chassis or a first side of a second chassis; and
a second connecting assembly rail connected to the mounting mechanism, wherein the second connecting assembly rail is configured to be connected to a second side of the first chassis or a second side of the second chassis; wherein the mounting mechanism has a planar lug portion and a generally L-shaped connecting portion connected to the lug portion and the second connecting assembly rail, wherein a first chassis hole and a second chassis hole spaced horizontally apart from the first chassis hole are each formed through the connecting portion, a second fastening hole and a first rack hole are each formed through the lug portion and spaced apart from each other; wherein the first rack hole of the lug portion is configured to align with the first fastening hole of the first post of the rack and a first fastener is configured to be inserted through the first rack hole and the first fastening hole to attach the lug portion to the first post of the rack;
wherein the first connecting assembly rail and the second connecting assembly rail are configured to mount the first chassis with a first chassis width to the rack when the first chassis hole is aligned with the second fastening hole of the lug portion and a second fastener is inserted through the first chassis hole and the second fastening hole, thereby defining a first distance between the first connecting assembly rail and the second connecting assembly rail that is approximate equal to the first chassis width;
wherein the first connecting assembly rail and the second connecting assembly rail are configured to mount the second chassis with a second chassis width to the rack when the second chassis hole is aligned with the second fastening hole of the lug portion and the second fastener is inserted through the second chassis hole and the second fastening hole, thereby defining a second distance between the first connecting assembly rail and the second connecting assembly rail that is approximate equal to the second chassis width, wherein, when in use, the second chassis width is different from the first chassis width.

6. The rack system of claim 5, wherein the first connecting assembly rail has a first connecting width, the second connecting assembly rail has a second connecting width; wherein the mounting mechanism is configured to inwardly extend a first mounting length from the first side of the rack when the mounting mechanism is attached to the first post of the rack, the first mounting length is greater than the first connecting width and the second connecting width.

7. The rack system of claim 5, wherein the first connecting assembly rail comprises a first fixed rail, and the second connecting assembly rail comprises a second fixed rail, wherein the first fixed rail and the second fixed rail are configured to fixedly mount the first chassis or the second chassis into the rack.

8. The rack system of claim 5, wherein the first connecting assembly rail comprises a first fixed rail and a first movable rail, and the second connecting assembly rail comprises a second fixed rail and a second movable rail, wherein the first movable rail and the second movable rail are configured to allow the first chassis to be pulled out of the first rack.

9. The rack system of claim 5, wherein the first connecting assembly rail comprises a first fixed rail and a first movable rail, and the second connecting assembly rail comprises a second fixed rail and a second movable rail, wherein the first movable rail and the second movable rail are configured to allow the second chassis to be pulled out of the rack.

* * * * *